(12) United States Patent
Kawahito et al.

(10) Patent No.: US 6,756,928 B2
(45) Date of Patent: Jun. 29, 2004

(54) PSEUDO-DIFFERENTIAL AMPLIFIER AND ANALOG-TO-DIGITAL CONVERTER USING THE SAME

(75) Inventors: Shoji Kawahito, Hamamatsu (JP); Daisuke Miyazaki, Hamamatsu (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 10/300,908

(22) Filed: Nov. 21, 2002

(65) Prior Publication Data

US 2003/0117308 A1 Jun. 26, 2003

(30) Foreign Application Priority Data

Nov. 21, 2001 (JP) ........................................ 2001-356074

(51) Int. Cl.[7] .............................................. H03M 1/12
(52) U.S. Cl. ...................................... 341/150; 341/172
(58) Field of Search ................................ 341/161, 155, 341/172, 162, 120, 131; 327/57; 330/258

(56) References Cited

U.S. PATENT DOCUMENTS

| | | | | |
|---|---|---|---|---|
| 5,629,700 A | * | 5/1997 | Kumamoto et al. | 341/161 |
| 5,696,511 A | * | 12/1997 | Matsumoto et al. | 341/161 |
| 5,739,781 A | * | 4/1998 | Kagey | 341/155 |
| 6,172,629 B1 | * | 1/2001 | Fetterman | 341/131 |
| 6,249,240 B1 | * | 6/2001 | Bellaouar | 341/172 |
| 6,288,575 B1 | * | 9/2001 | Forbes | 327/57 |
| 6,304,206 B1 | * | 10/2001 | Wada et al. | 341/162 |
| 6,380,806 B1 | * | 4/2002 | Ang | 330/258 |
| 6,396,429 B2 | * | 5/2002 | Singer et al. | 341/155 |
| 6,489,904 B1 | * | 12/2002 | Hisano | 341/120 |

OTHER PUBLICATIONS

Sibum, Jun et al., "Phase–tunable CMOS Triode Transconductor," Circuits and Systems, 1998, ISCAS '98, Proceedings of the 1998 IEEE International Symposium on Monterey, CA, USA May 31–Jun. 3, 1998, New York, NY, USA, IEEE, US May 31, 1998 pp. 112–114.

Wu, L et al., "Efficient Common–Mode Feedback Circuits for Psuedo–Differential Switched–Capacitor Stages," ISCAS 2000–IEEE International Symposium on Circuits and Systems, May 28–31, 2000, pp. V–445 –V–448.

* cited by examiner

Primary Examiner—Jean Bruner Jeanglaude
(74) Attorney, Agent, or Firm—Birch, Stewart, Kolasch & Birch, LLP

(57) ABSTRACT

A pseudo-differential amplifier circuit 1 is constructed from two equivalent amplifiers 2 and 3 that amplify a pair of input signals without using a differential pair. This pseudo-differential amplifier circuit 1 is used in an arithmetic unit in each of the A-D converter circuits AD1 through ADm in a parallel pipeline A-D converter 10.

6 Claims, 9 Drawing Sheets

PSEUDO-DIFFERENTIAL AMPLIFIER AND ANALOG-TO-DIGITAL CONVERTER USING THE SAME

BACKGROUND OF THE INVENTION

1. Field of the Invention

The present invention relates to a pseudo-differential amplifier circuit including two amplifiers and an A-D (analog-to digital) converter using the pseudo-differential amplifier circuit and, more particularly, to a pipeline A-D converter using the pseudo-differential amplifier.

2. Description of the Related Art

Figure 10:
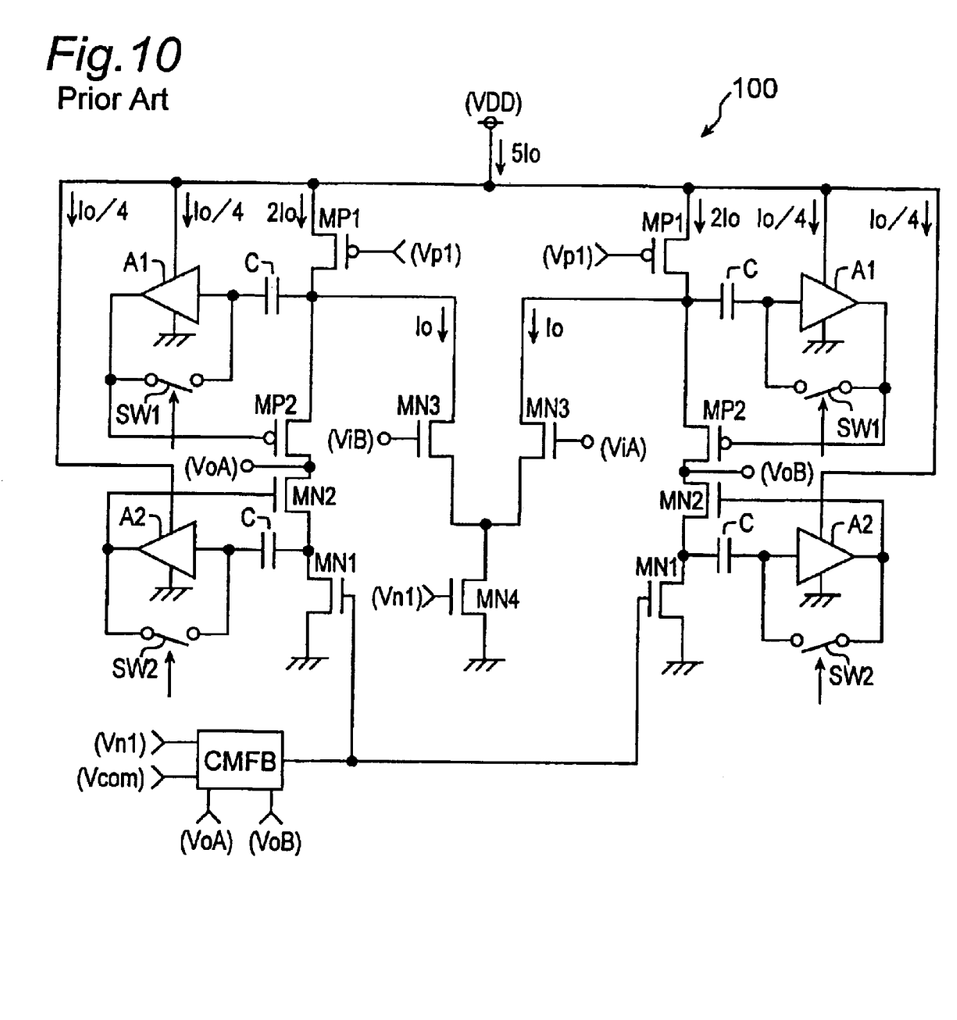
FIG. 10 is a circuitry diagram showing a prior differential amplifier circuit used in pipeline A-D converters.

A pipeline A-D converter using a differential amplifier circuit is publicly known. An example of the differential amplifier circuit is shown in FIG. 10. In the differential amplifier circuit 100 in FIG. 10, a predetermined voltage $V_p1$ is applied to the gate of each PMOS transistor MP1, and a predetermined voltage $V_n1$ is applied to the gate of an NMOS transistor MN4. Each gate of two NMOS transistors MN3 that make up a differential pair is an input terminal to the differential amplifier circuit 100, and two input voltages ViA and ViB are respectively input to the input terminals.

Further, each junction between PMOS transistors MP2 and NMOS transistors MN2 is an output terminal of the differential amplifier circuit 100, and output voltages VoA and VoB are respectively output from the output terminals. The output signal of a common-mode feedback circuit CMFB is input to the gate of each NMOS transistor MN1, and the output voltages VoA and VoB are adjusted thereby.

Here, let lo denote the current flowing through the NMOS transistors MN3 that make up a differential pair. Then, a source current Io/4 flows through each of the inverter amplifiers A1 and A2 that form a feedback circuit. The current Io flows through each series-connected circuit consisting of PMOS transistor MP2 and NMOS transistors MN2 and MN1. Two switches SW1 and SW2 are turned on, to form conductive states, when a signal input to the A-D converter is sampled. When the signal input to the A-D converter is held, both switches are turned off, to form cut-off states.

In recent years, as communication speed in mobile communications and the Internet has become high, the resolution and quality of images in video apparatus have become high, and the speed in disk media have become high, demand for high performance A-D converters has been accelerated. In particular, A-D converters that achieve high speed and high precision at low voltage and low power consumption by using CMOS have been desired.

However, the differential amplifier circuit 100 shown in FIG. 10 is a complete differential type and requires a large amount of bias current for desired output current. Therefore, such a differential amplifier circuit is inefficient with high power consumption, so that it has been disqualified for achieving reduction of power consumption in an A-D converter. Further, the differential amplifier circuit 100 of complete differential type has multi-stages of transistors connected in series between a source voltage and the ground, so that operation at low voltage is limited. Therefore, it has also been disqualified for reduction of voltage in an A-D converter.

SUMMARY OF THE INVENTION

The present invention has been made to solve the above problems. Its first object is thus to provide a pseudo-differential amplifier circuit that achieves low power consumption by composing a pseudo differential amplifier circuit using two cascade amplifiers in place of a differential amplifier circuit and also operates at low voltage.

Further, the second object of the present invention is to provide an A-D converter that uses the above pseudo-differential amplifier circuit.

According to an aspect of the present invention, a pseudo-differential amplifier circuit includes a first amplifier that amplifies and outputs a first input signal, a second amplifier that amplifies and outputs a second input signal, which has the opposite signal level of the first input signal. The above first and second amplifiers are of the same circuit configuration, have the same characteristics, each operable to pseudo-amplify and output one of the pair of input first and second signals.

According to the present invention, a pseudo-differential amplifier circuit is formed, without a differential pair used, from a pair of first and second amplifiers having the same circuitry and characteristics and respectively amplifying a pair of input signals. Therefore, it is possible to obtain a circuit that has the function of differential amplification and operates at low voltage as well as low power consumption.

The pseudo-differential amplifier circuit may have first and second capacitors connected in series between the output terminals of the first and second amplifiers, third and fourth capacitors connected in series between the input terminals of the first and second amplifiers, a buffer section that conveys the voltage at the junction between the first and second capacitors to the junction between the third and fourth capacitors, and a switch section that applies a predetermined voltage to the junction between the first and second capacitors and controls the voltage, depending on input control signals. By these means, fluctuations in average value of the output voltages of the amplifiers in the pseudo-differential amplifier circuit can be prevented, so that a high-performance pseudo-differential amplifier circuit that achieves reduction of power consumption and operation at low voltage can be obtained.

Specifically, when a predetermined voltage is applied from the switch section, the first and second capacitors respectively memorize the voltage difference between the predetermined voltage and the average value of the two signals output from the first and second amplifiers. On the other hand, the third and fourth capacitors make the voltage difference applied to the amplifiers through the buffer section. Construction in this way prevents the average value of the output voltages of the amplifiers in the pseudo-differential amplifier circuit from fluctuating, and a high-performance A-D converter that can achieve low power consumption and low-voltage operation can be obtained.

An A-D converter in accordance with another aspect of the present invention is equipped with a sampling and hold circuit that samples and holds a pair of analog signals having mutually opposite voltage levels and a plurality of A-D converter circuits that A-D convert a pair of output signals output from the sampling and hold circuit and perform predetermined computation to output the results as a pair of input voltages to a next-stage A-D converter circuit. Each of these A-D converter circuits in the A-D converter has a sub-A-D converter that A-D converts a pair of input voltages, a sub-D-A converter that D-A converts the data obtained by the A-D conversion, a pair of arithmetic units that respectively perform arithmetic operations for the input pair of voltages using the voltages obtained by the sub-D-A converter, and a pseudo-differential amplifier circuit consisting of a pair of amplifiers that have the same circuitry and the same characteristics and performing pseudo-differential amplification for the voltages obtained by the arithmetic units.

In the A-D converter, a pseudo-differential amplifier circuit is used in each of the A-D converter circuits that perform A-D conversion and predetermined computation for a pair of output signals output from the sampling and hold circuit to output the results as a pair of input voltages to a next-stage A-D converter circuit. By this means, low power consumption and low-voltage operation can be achieved.

According to another aspect of the present invention, an A-D converter includes a sampling and hold circuit that samples and holds a pair of analog signals having mutually opposite voltage levels and a plurality of A-D converter circuits that A-D convert a pair of output signals output from the sampling and hold circuit and perform predetermined computation to output the results as a pair of input voltages to a next-stage A-D converter circuit. At least one of these A-D converter circuits includes a sub-A-D converter that A-D converts a pair of input voltages, a sub-D-A converter that D-A converts the data obtained by the A-D conversion, a pair of arithmetic units that respectively perform arithmetic operations for the input voltages using the voltage obtained by the sub-D-A converter, and a pseudo-differential amplifier circuit including a pair of amplifiers that have the same circuitry and the same characteristics and performing pseudo-differential amplification for the voltages obtained by the arithmetic units.

Further, in the A-D converter, a pseudo-differential amplifier circuit is used in at least one of the A-D converter circuits that perform A-D conversion and predetermined computation for a pair of output signals output from the sampling and hold circuit to output the results as a pair of input voltages to a next-stage A-D converter circuit. An ordinary differential amplifier circuit is used in the other A-D converter circuits. By these means, while low power consumption and low-power operation in the A-D converter can be achieved, a decline in performance caused by fluctuations in the average value of the output voltages of the amplifiers in the pseudo-differential amplifier circuit can be prevented. Therefore, a high performance A-D converter that achieves low power consumption and low-voltage operation can be obtained.

In this case, each of the other ordinary A-D converter circuits of the above A-D converter circuits may have a sub-A-D converter that A-D converts a pair of input voltages, a sub-D-A converter that D-A converts the data obtained by the A-D conversion, a pair of arithmetic units that respectively perform arithmetic operations for the input voltages using the voltages obtained by the sub-D-A converter, and a differential amplifier circuit that performs differential amplification for the voltages obtained by the arithmetic units.

Preferably, the above pseudo-differential amplifier circuit includes first and second capacitors connected in series between the output terminals of the above amplifiers, third and fourth capacitors connected in series between the input terminals of the above amplifiers, a buffer section that conveys the voltage at the junction between the first and second capacitors to the junction between the third and fourth capacitors, and a switch section that applies a predetermined voltage to the junction between the first and second capacitors and controls the voltage, depending on input control signals.

In this case, when a predetermined voltage is applied from the switch section, the first and second capacitors respectively memorize the voltage difference between the predetermined voltage and the average value of the two signals output from the amplifiers. On the other hand, the third and fourth capacitors make the voltage difference be applied to the amplifiers through the buffer section. In all cases, each amplifier in the pseudo-differential amplifier of the present invention may be a single-end amplifier. If the first and second amplifiers are single-end amplifiers, further reduction of power consumption and operation at lower voltage can be achieved.

BRIEF DESCRIPTION OF THE DRAWINGS

The present invention will become readily understood from the following description of preferred embodiments thereof made with reference to the accompanying drawings, in which like parts are designated by like reference numerals and in which.

DESCRIPTION OF THE PREFERRED EMBODIMENTS

First Embodiment

Figure 1:
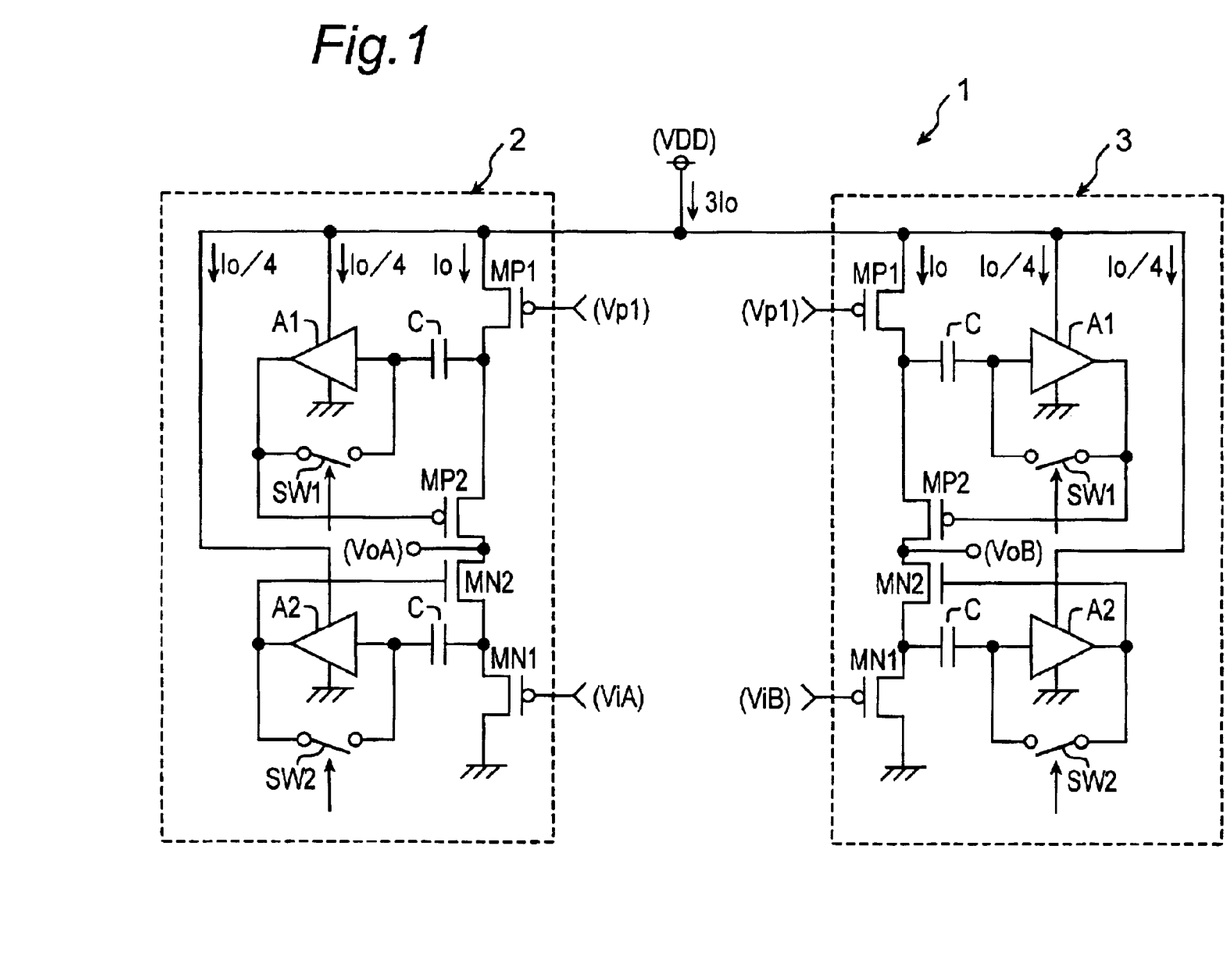
FIG. 1 is a circuitry diagram showing a pseudo-differential amplifier circuit in a first embodiment of the present invention.

A circuitry diagram of a pseudo-differential amplifier circuit in a first embodiment of the present invention is shown in FIG. 1. In the following description, a pseudo-differential amplifier circuit means a circuit that uses two amplifiers and operates as a differential amplifier circuit.

A pseudo-differential amplifier circuit 1 shown in FIG. 1 is formed from two single-end amplifiers 2 and 3, which have the same circuitry and the same characteristics. FIG. 1 shows a case where the single-end amplifiers 2 and 3 described in IEIC Trans. Fundamentals, Vol. E82-A, No. 2 Feb. 1999 are used. Since these amplifiers have the same circuitry, amplifier 2 is described in details in the following.

Amplifier 2 includes inverter amplifiers A1 and A2, PMOS transistors MP1 and MP2, NMOS transistors MN1 and MN2, switches SW1 and SW2, and capacitors C1 and C2. A series-connected circuit composed of PMOS transistor MP1, PMOS transistor MP2, NMOS transistor MN2, and NMOS transistor MN1 is connected between a source voltage VDD and the ground. A predetermined constant voltage Vp1 is applied to the gate of PMOS transistor MP1. The gate of NMOS transistor MN1 forms the input terminal for amplifier 2, and the junction between PMOS transistor MP2 and NMOS transistor MN2 forms the output terminal of amplifier 2.

A series-connected circuit composed of inverter amplifier A1 and capacitor C1 forms a feedback circuit for PMOS transistor MP2, and a series-connected circuit composed of inverter amplifier A2 and capacitor C2 forms a feedback circuit for NMOS transistor MN2. Switch SW1 is connected between the output terminal and input terminal of inverter amplifier A1, and switch SW2 is connected between the output terminal and input terminal of inverter amplifier A2. Switches SW1 and SW2 perform switching by turning to "on" and "off," depending on a signal output from the outside. In a case where the pseudo-differential amplifier circuit 1 is used in a pipeline A-D converter, for example, when the signal input to the A-D converter is sampled, switches SW1 and SW2 are turned on, to form conductive states. When the signal input to the A-D converter is held, the switches are turned off, to form cut-off states.

Figure 2:
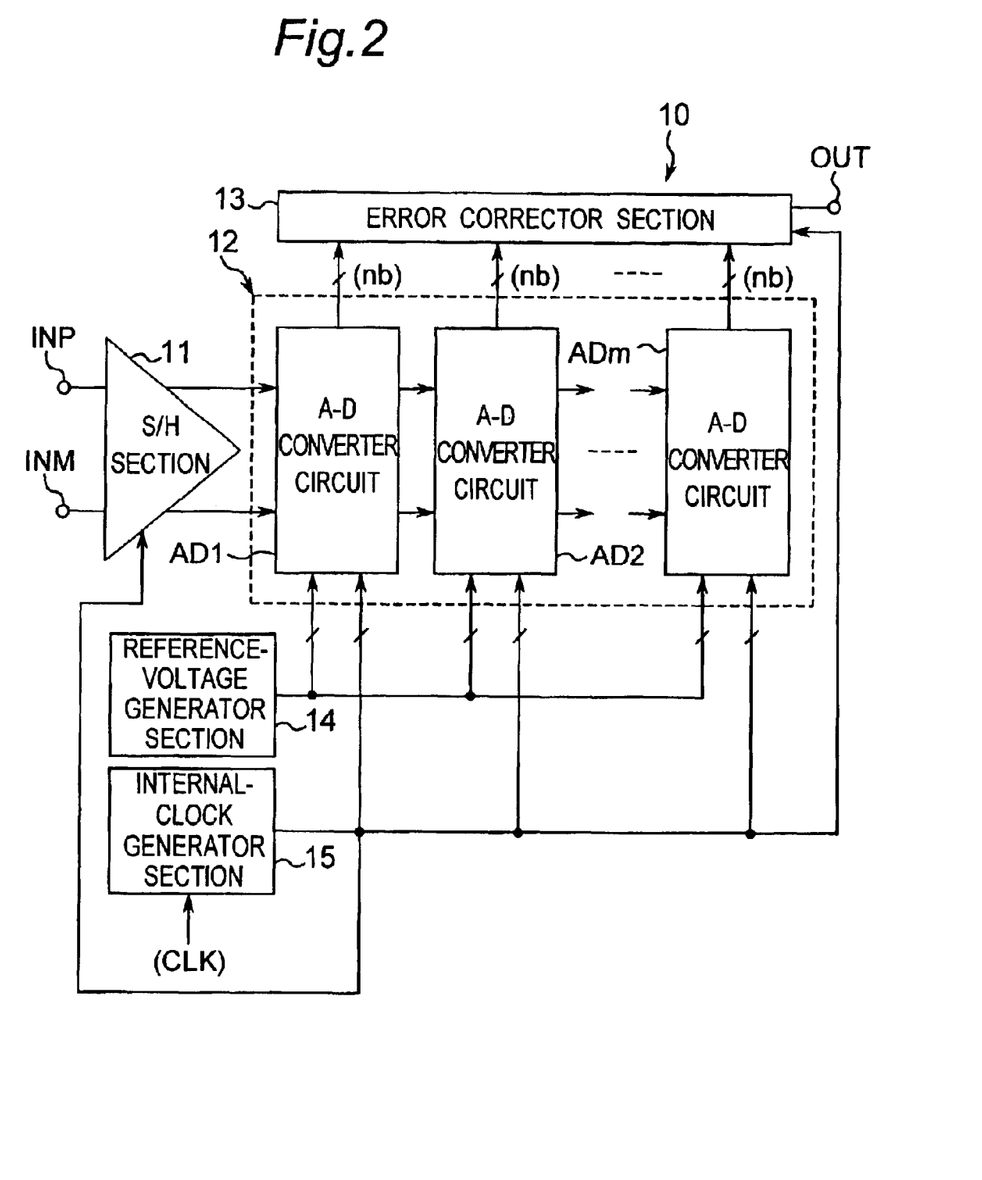
FIG. 2 is a schematic block diagram showing a pipeline A-D converter using the pseudo-differential amplifier circuit 1 in FIG. 1.

In such a construction, the pseudo-differential amplifier circuit 1 can reduce the current flowing through the differential pair of the prior differential amplifier circuit shown in FIG. 10 by 2×Io. Specifically, the pseudo-differential amplifier circuit 1 consumes a total amount of 3×Io consisting of the current Io/4 that flows each of the amplifiers A1 and A2 and the current Io that flows through each of the series-connected circuits composed of the PMOS transistor MP2 and NMOS transistors MN2 and MN1. In this way, the current consumed in the pseudo-differential amplifier circuit 1 is considerably less than the current 5×Io consumed in the prior differential amplifier circuit Next, the pseudo-differential amplifier circuit 1 in FIG. 1 that is used in a parallel pipeline A-D converter is described. FIG. 2 is a schematic block diagram showing an example of the configuration of a parallel pipeline A-D converter that uses the pseudo-differential amplifier 1 in FIG. 1.

In FIG. 2, a parallel pipeline A-D converter 10 has a sampling and hold circuit 11 (hereinafter referred to as S/H section), to which two analog signals having symmetric waveforms around a predetermined voltage, e.g. the ground voltage, are input, an A-D converter section 12 consisting of m-stage pipeline A-D converter circuits AD1 through ADm, where m is a positive integer, and an error corrector section 13 that performs error correction for digital data output from the A-D converter section 12.

Further, the parallel pipeline A-D converter 10 has a reference-voltage generator section 14 that generates a plurality of different reference voltages to output to each of the A-D converter circuits AD1 through ADm and an internal-clock generator section 15 that generates predetermined internal clock signals from the external clock signal CLK to output to S/H section 11, A-D converter section 12, and error corrector section 13.

The S/H section 11 has two input terminals, a positive-side input terminal and a negative-side input terminal, which form the input terminals to the parallel pipeline A-D converter 10. The positive-side input terminal receives a positive-side analog signal, and the negative-side input terminal receives a negative-side analog signal. The positive-side and negative-side analog signals are a pair of signals that have mutually opposite signal levels. The S/H section 11 performs sampling and holding for the input analog signals, based on the predetermined clock signals from the internal clock generator circuit 15 and then outputs to the A-D converter section 12.

The A-D converter section 12 includes m stages of pipeline A-D converter circuits AD1 through ADm of the same circuitry, and each of the pipeline A-D converter circuits AD1 through ADm forms an n-bit pipeline A-D converter, where n>0.

An A-D converter circuit $AD_k$ receives a positive-side output signal and a negative-side output signal having mutually opposite signal levels from a preceding circuit stage. Specifically, the first-stage A-D converter circuit AD1 receives the positive-side and negative-side output voltages from S/H section 11, and the A-D converter circuit $AD_k$, where 2<k<m, receives the positive-side and negative-side output voltages from the preceding A-D converter circuit AD(k−1).

Figure 3:
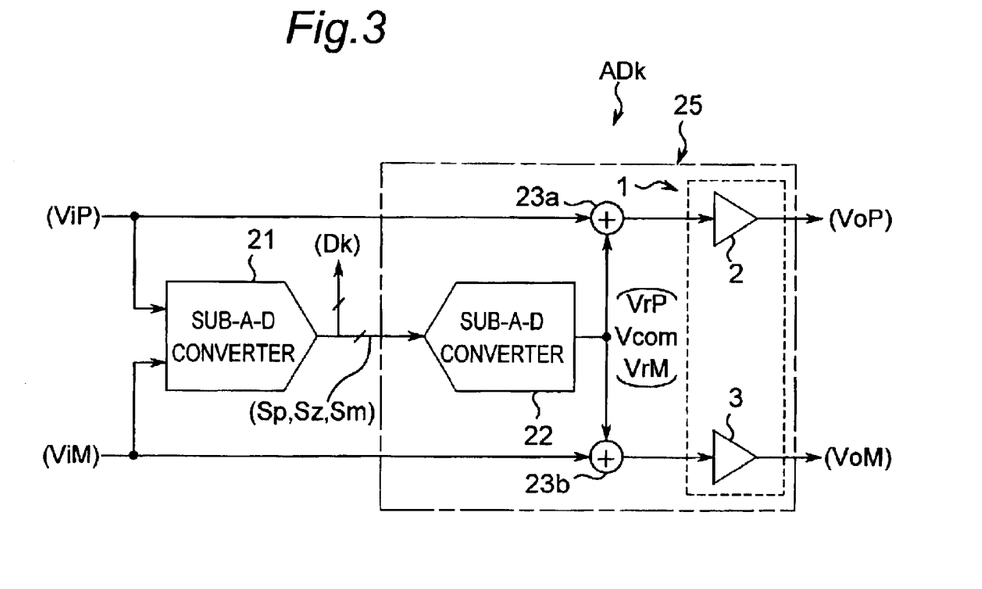
FIG. 3 is a schematic block diagram showing the internal configuration of the A-D converter $AD_k$ in FIG. 2.

FIG. 3 is a schematic block diagram showing the internal configuration of the A-D converter circuit ADk. In FIG. 3, the A-D converter circuit ADk has a sub-A-D converter 21 that forms an n-bit A-D converter, a sub-D-A converter 22 that forms an n-bit D-A converter, a pair of arithmetic units 23a and 23b, and a pseudo differential amplifier circuit 1 composed of amplifiers 2 and 3 in FIG. 1. Sub-A-D converter 21 receives a pair of output signals output from the preceding circuit stage as the pair of a positive-side input voltage ViP and a negative-side input voltage ViM. Sub-AD converter 21 A-D converts and outputs the received positive-side input voltage ViP and negative-side input voltage ViM to n-bit data to the error corrector section 13 and also outputs signals corresponding to the n-bit data to sub-D-A converter 22.

Back to FIG. 2, the n-bit data output from each of the A-D converter circuit AD1 through ADm is a kind of redundant representation. The error corrector section 13 converts the n-bit data input from each of the A-D converter circuits AD1 through ADm into bit data of a predetermined bit length, which is an irredundant representation, to output from the output terminal OUT as A-D converted digital data. For example, if 1.5-bit data is output from each of the A-D converter circuits AD1 through ADm, the error corrector section 13 converts the 1.5-bit data into 1-bit data to output as A-D converted digital data.

Further, in FIG. 3, sub-D-A converter 22 outputs a voltage corresponding to the signal input from sub-A-D converter 21 to arithmetic units 23a and 23b. Arithmetic unit 23a performs predetermined arithmetic operations for the positive-side input voltage ViP and the output voltage from sub-D-A converter 22 to output the results to amplifier 2. Arithmetic unit 23b performs predetermined arithmetic operations for the negative-side input voltage ViM and the output voltage from sub-D-A converter 22 to output the results to amplifier 3. Amplifier 2 amplifies the input voltage to output as a positive-side output voltage VoP, and the amplifier 3 amplifies the input voltage to output as a negative-side output voltage VoM.

Next, the operation of the A-D converter circuit ADk is described for the case in which sub-A-D converter 21 is a 1.5-bit A-D converter, and sub-D-A converter 22 is a 1.5-bit D-A converter.

Sub-A-D converter 21 calculates the input voltage Vi from the input positive-side input voltage ViP and negative-side input voltage ViM by the following equation (1):

$$Vi = ViP - ViM \qquad (1)$$

Sub-A-D converter 21 receives predetermined reference voltages VrCP and VrCM from the reference-voltage generator section 14. Sub-A-D converter 21 compares the input voltage Vi in the equation (1) with the reference voltages VrCP and VrCM to generate the data Dk by the following equation (2), depending on the comparison results:

$$Dk=1 \text{ if } VrCP<Vi, \quad (2)$$

$$Dk=0 \text{ if } VrCM \leq Vi \leq VrCP, \quad (3)$$

$$Dk=-1 \text{ if } Vi<VrCM. \quad (4)$$

On the other hand, sub-D-A converter 22 receives three kinds of predetermined reference voltages VrP, Vcom, and VrM from the reference-voltage generator circuit 14. Here, VrCP=VrP/4 and VrCM=VrM/4. For example, Vcom=0, VrP=Vr, and VrM=−Vr for some Vr. In this case, VrCP=Vr/4, VrCM=−Vr/4. Further, sub-D-A converter 22, arithmetic units 23a and 23b, and amplifiers 2 and 3 form an arithmetic circuit 25. Sub-D-A converter 22, arithmetic units 23a, and amplifier 2 generates the positive-side output voltage VoP by performing the arithmetic operation according to the following equation (5), and sub-D-A converter 22, arithmetic unit 23b, and amplifier 3 generates the negative-side output voltage VoM by performing the arithmetic operation according to the following equation (6).

$$VoP=2\times ViP-RkP, \quad (5)$$

$$VoM=2\times ViM-RkM, \quad (6)$$

Where
RkP=VrP and RkM=VrM, if Dk=1,
RkP=Vcom and RkM=Vcom, if Dk=0,
RkP=VrM and RkM=VrP, if Dk=−1.

In this way, arithmetic circuit 25 doubles both the positive-side input voltage ViP and the negative-side input voltage Vim and adds or subtracts a predetermined voltage depending on the data Dk generated by sub-A-D amplifier 21 to generate the positive-side output voltage VoP and the negative-side output voltage VoM and output them to the proceeding-stage A-D converter. The final-stage A-D converter ADm does not require arithmetic circuit 25.

Figure 4:
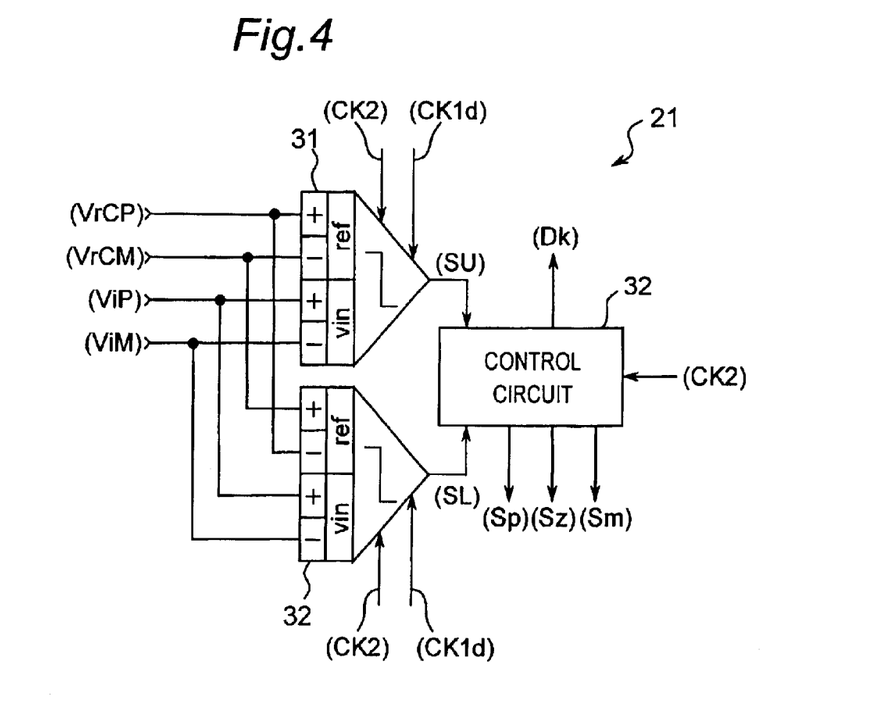
FIG. 4 is a drawing showing the configuration of sub-A-D converter 21 in FIG. 2.
Figure 5:
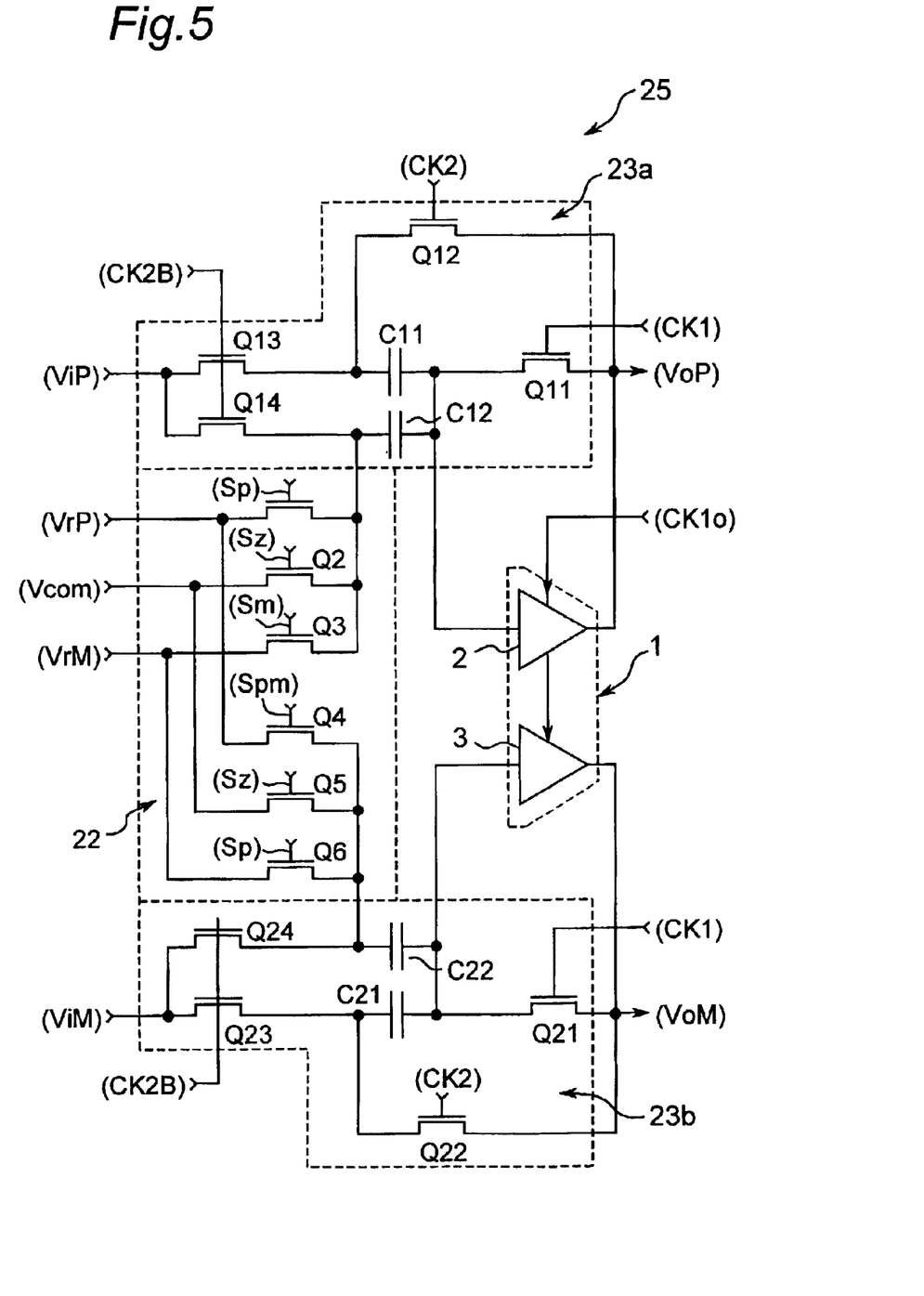
FIG. 5 is a circuitry diagram showing the arithmetic circuit 25 in FIG. 2.
Figure 6:
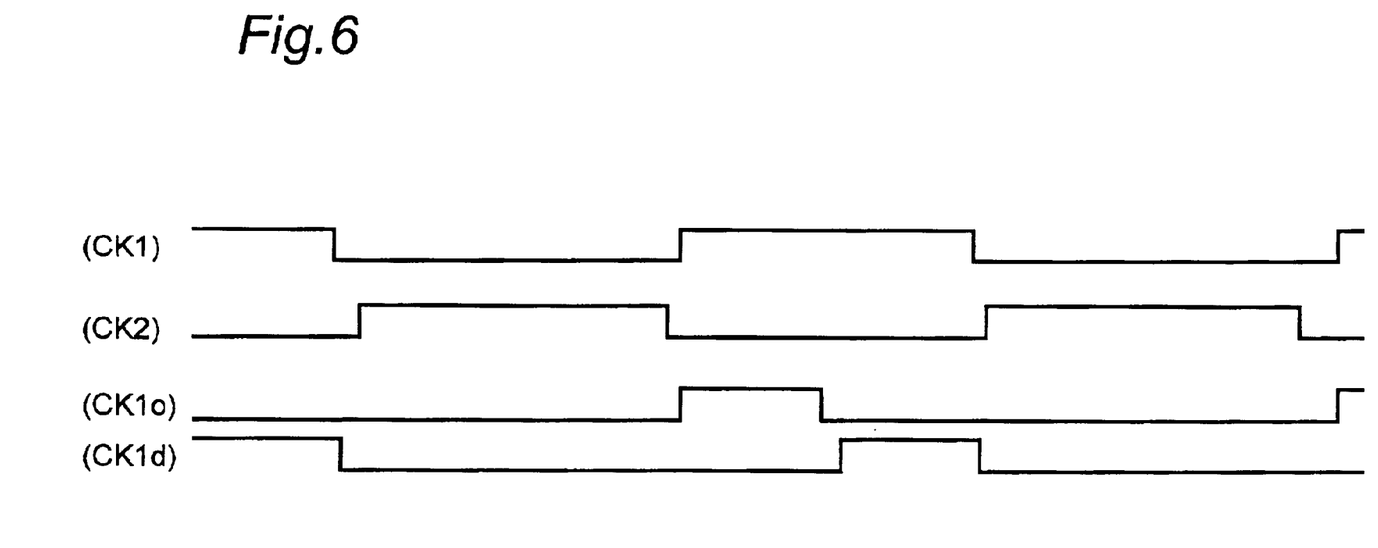
FIG. 6 is a timing diagram showing each internal clock signal input to sub-A-D converter 21 and the arithmetic circuit 25 in FIGS. 4 and 5.

Next, examples of the concrete internal configurations of sub-A-D converter 21 and arithmetic circuit 25 are shown, and the operation of each component is described. FIG. 4 is a drawing showing the configuration of sub-A-D converter 21, and FIG. 5 is a drawing showing an exemplary circuit of arithmetic circuit 25. Further, FIG. 6 is a timing diagram showing an example of each internal clock signal input to sub-A-D converter 21 and arithmetic circuit 25.

In FIG. 4, sub-A-D converter 21 includes two comparators 31 and 32 and a control circuit 33 consisting in a control-logic circuit that generates control signals Sp, Sm, and Sz, depending on the comparison results obtained from comparators 31 and 32, to output to sub-D-A converter 22.

Here, if Vi=ViP−ViM and ΔVR=VrCP−VrCM, then comparator 31 compares the voltages of Vi and ΔVR/4 and outputs an output signal SU that indicates the comparison results to control circuit 33. Comparator 32 compares the voltages of Vi and −ΔVR/4 and outputs an output signal SL that indicates the comparison results to control circuit 33. For example, if ΔVR/4<Vi, then both output signals SU and SL become high level ("High"). If −ΔVR/4 ≦Vi≦ΔVR/4, then the output signal SU becomes low level ("Low"), and the output signal SL becomes "High." If Vi<−ΔVR/4, then both output signals SU and SL become "Low."

If the output signals SU and SL input to control circuit 33 indicate ΔVR/4<Vi, control circuit 33 makes only the control signal Sp "High," and makes the control signals Sm and Sz "Low." If the output signals SU and SL indicate −ΔVR/4≦Vi≦ΔVR/4, control circuit 33 makes only the control signal Sz "High," and makes the control signals Sp and Sm "Low." If the output signals SU and SL indicate Vi<−ΔVR/4, control circuit 33 makes only the control signal Sm "High," and makes the control signals Sp and Sz "Low."

If the output signals SU and SL indicate ΔVR/4<Vi, control circuit 33 outputs the data Dk=1 to the error corrector section 13; if the output signals SU and SL, indicate −ΔVR/4≦Vi≦ΔVR/4, control circuit 33 outputs the data Dk=0 to the error corrector section 13; and if the output signals SU and SL indicate Vi<−ΔVR/4, control circuit 33 outputs the data Dk=−1 to the error corrector section 13.

Next, in FIG. 5, sub-D-A converter 22 includes NMOS transistors Q1 through Q6; arithmetic unit 23a includes NMOS transistors Q11 through Q14 and capacitors C11 and C12; and arithmetic unit 23b includes NMOS transistors Q21 through Q24 and capacitors C21 and C22. Capacitors C11, C12, C21, and C22 have the same capacitance. Amplifiers 2 and 3 form the pseudo-differential amplifier circuit 1. Switches SW1 and SW2 of amplifiers 2 and 3 perform switching, depending on a predetermined internal clock signal CKIo output from the internal-clock generator section 15.

In sub-D-A converter 22, the control signal Sp from sub-A-D converter 21 is input to the gates of NMOS transistors Q1 and Q4; the control signal Sz from sub-A-D converter 21 is input to the gates of NMOS transistors Q2 and Q5; and the control signal Sm from sub-A-D converter 21 is input to the gates of NMOS transistors Q3 and Q4. The reference voltage VrP from the reference-voltage generator section 14 is applied to NMOS transistors Q1 and Q4. When NMOS transistor Q1 is turned on, the reference voltage VrP is applied to capacitor C12 in arithmetic unit 23a; when NMOS transistor Q4 is turned on, the reference voltage VrP is applied to capacitance C22 in arithmetic unit 23b.

The reference voltage Vcom from the reference-voltage generator section 14 is applied to NMOS transistors Q2 and Q5. When the NMOS transistors Q2 and Q5 are turned on, the reference voltage Vcom is respectively applied to capacitor C12 of arithmetic unit 23a and capacitor C22 in arithmetic unit 23b. Similarly, the reference voltage VrM from the reference-voltage generator section 14 is applied to NMOS transistors Q3 and Q6. When NMOS transistor Q3 is turned on, the reference voltage VrM is applied to capacitor C12 in arithmetic unit 23a; when NMOS transistor Q6 is turned on, the reference voltage VrM is applied to capacitor C22 in arithmetic unit 23b.

Next, in arithmetic unit 23a, the internal clock signal CK1 from the internal-clock generator section 15 is input to the gate of NMOS transistor Q11; the internal clock signal CK2 from the internal-clock generator section 15 is input to the gate of NMOS transistor Q12. Further, the inverted signal CK2B obtained by inverting signal level of the internal clock signal CK2 is input to the gates of the NMOS transistors Q13 and Q14. When NMOS transistors Q13 and Q14 are turned on, the positive-side input voltage ViP is applied to capacitors C11 and C12. At this time, NMOS transistor Q11 is tuned on, and NMOS transistor Q12 is turned off, so that amplifier 2 is short-circuited, and capacitors C11 and C12 are charged with the positive-side input voltage Vip, and the sampling of the positive-side input voltage ViP is performed. When the sampling of the positive-side input voltage ViP is performed, amplifier 2 is short-circuited, so that amplifier 2 does not require a large amplification factor. Therefore, amplifier 2 turns switches SW1 and SW2 shown in FIG. 1 on by internal clock signal CKIo and short-circuits the inverter amplifiers A1 and A2.

Next, amplifier 2 turns NMOS transistors Q11, Q13, and Q14 on, and connects capacitor C11 to itself by turning NMOS transistor Q12 on. In this case, since amplifier 2 requires a large amplification factor, amplifier 2 turns switches SW1 and SW2 shown in FIG. 1 off by internal clock signal CKIo, and makes inverter amplifiers A1 and A2 operate. At this time, control signals Sp, Sz, and Sm are output from control circuit 33 in sub-A-D converter 21, and a selected transistor of the NMOS transistors Q1, Q2, and Q3 is turned on, so that one and only one of the reference voltages VrP, Vcom, VrM is applied to capacitor C12. In this way, arithmetic unit 23a performs predetermined arithmetic operations, and amplifier 2 performs predetermined amplification, so that the positive-side output voltage VoP can be obtained.

Similarly, in arithmetic unit 23b, the internal clock signal CK1 from the internal-clock generator section 15 is input to the gate of NMOS transistor Q21; the internal clock signal CK2 from the internal-clock generator section 15 is input to the gate of NMOS transistor Q22. Further, the inverted signal CK2B is input to the gates of the NMOS transistors Q23 and Q24. When NMOS transistors Q23 and Q24 are turned on, the negative-side input voltage ViM is applied to capacitors C21 and C22. At this time, NMOS transistor Q21 is turned on, and NMOS transistor Q22 is turned off, so that amplifier 3 is short-circuited. Therefore, capacitors C21 and C22 are charged with the negative-side input voltage ViM, and the sampling of the negative-side input voltage ViM is performed. When the sampling of the negative-side input voltage Vim is performed, amplifier 3 is short-circuited, so that amplifier 3 does not require a large amplification factor. Therefore, amplifier 3 turns switches SW1 and SW2 shown in FIG. 1 on by internal clock signal CKIo and short-circuits the inverter amplifiers A1 and A2.

Next, amplifier 3 turns NMOS transistors Q21, Q23, and Q24, and connects capacitor C21 to itself by turning NMOS transistor Q22 on. In this case, since amplifier 3 requires a large amplification factor, amplifier 3 turns switches SW1 and SW2 shown in FIG. 1 off by internal clock signal CKIo, and makes inverter amplifiers A1 and A2 operate. At this time, control signals Sp, Sz, and Sm are output from control circuit 33 in sub-A-D converter 21, and a selected transistor of the NMOS transistors Q4, Q5, and Q6 is turned on, so that one and only one of the reference voltages VrP, Vcom, VrM is applied to capacitor C22. In this way, arithmetic unit 23b performs predetermined arithmetic operations, and amplifier 3 performs predetermined amplification, so that the negative-side output voltage VoM can be obtained.

In this way, the pseudo-differential amplifier circuit 1 shown in FIG. 1 can be used in each arithmetic unit 25 of the A-D converter circuits AD1 through ADm in the parallel pipeline A-D converter 10. By this means, the low power consumption and low-voltage operation in the parallel pipeline A-D converter 10 can be achieved.

On the other hand, if the characteristics of amplifiers 2 and 3 used in the pseudo-differential amplifier 1 as described above differ, the common-mode voltage, i.e. the average of the positive-side output voltage VoP and the negative-side output voltage VoM, may fluctuate. As the number m of A-D converters AD1 through ADm becomes larger, these fluctuations become greater, and the performance of the parallel pipeline A-D converter 10 declines.

Figure 7:
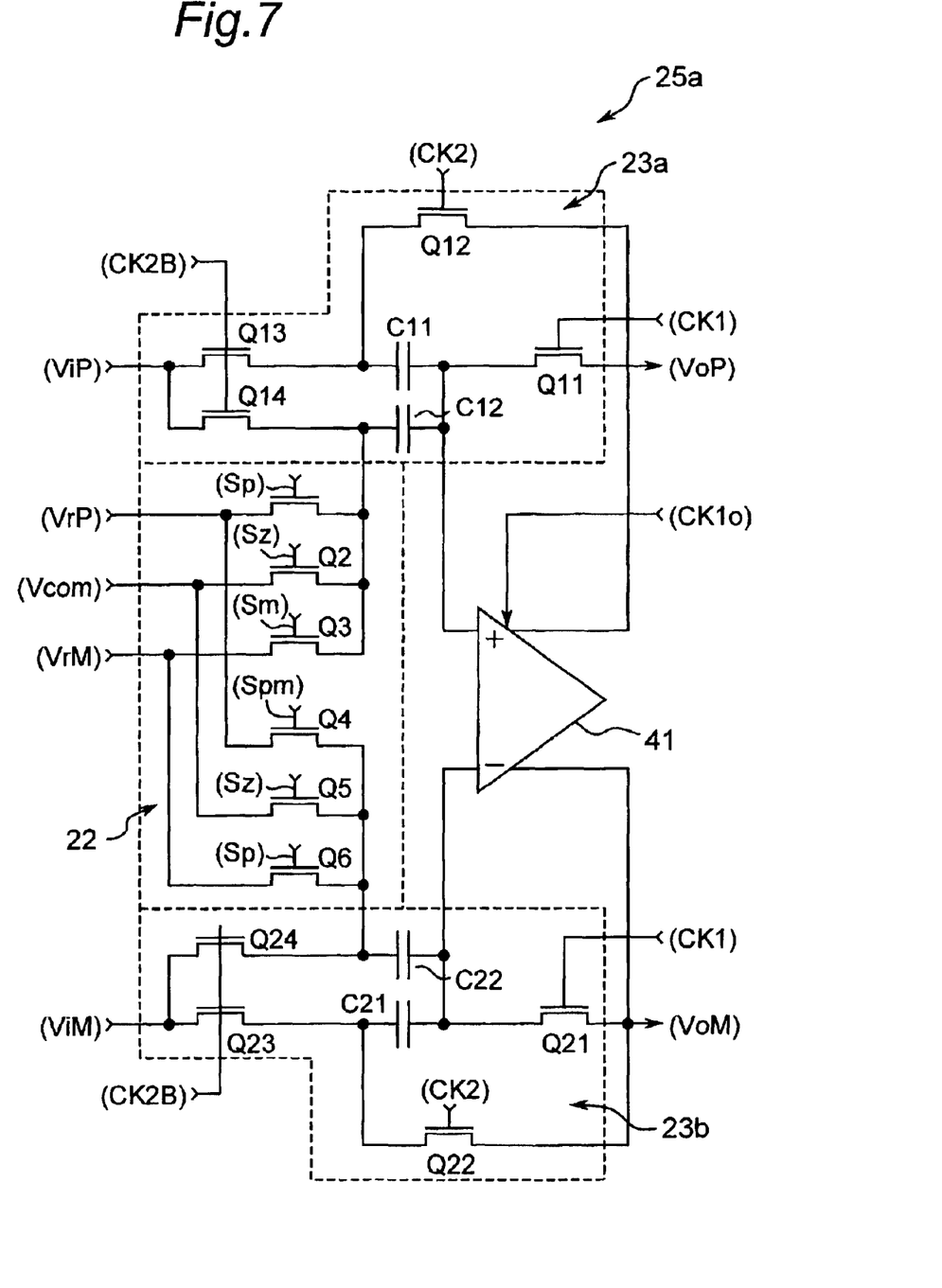
FIG. 7 is a drawing showing the case where an ordinary differential amplifier circuit is used in place of the pseudo-differential amplifier circuit 1 in FIG. 5.

Therefore, an A-D converter circuit 40 in which the pseudo-differential amplifier circuit 1 is replaced with an ordinary differential amplifier circuit 41 as shown in FIG. 7 may be used for each A-D converter circuit in predetermined places, e.g. in every three places or four places, of the A-D converter circuits AD1 through ADm. For example, the differential amplifier circuit 100 shown in FIG. 10 may be used as the differential amplifier circuit 41. In this way, the generated voltage fluctuations of common-mode can be removed in A-D converter circuit 40, and the performance decline in the parallel pipeline A-D converter 10 can be prevented. Therefore, even if the characteristics of amplifiers 2 and 3 differ, low power consumption and low-voltage operation in the parallel pipeline A-D converter 10 can be achieved without any performance decline.

As described so far, the pseudo-differential amplifier circuit in the first embodiment of the present invention forms a pseudo differential amplifier circuit 1, using a pair of amplifiers 2 and 3 that amplify correspondingly a pair of input signals without using a differential pair. By this means, we have obtained a circuit that has the function of differential amplification and achieves operation at lower voltage as well as reduction of power consumption. Further, we have used such a pseudo-differential amplifier circuit 1 in arithmetic unit 25 of each A-D converter circuit AD1 through ADm in the parallel pipeline A-D converter 10. By this means, we have achieved reduction of power consumption and operation at lower voltage for A-D converters.

In the above first embodiment, when the characteristics of amplifiers 2 and 3 in the pseudo-differential amplifier circuit 1 become different, there is a possibility that voltage fluctuations of common-mode may occur. However, a circuit that corrects voltage fluctuations of common-mode may be installed in the pseudo-differential amplifier circuit. This case is described in the following second embodiment with reference to FIG. 8.

Second Embodiment

Figure 8:
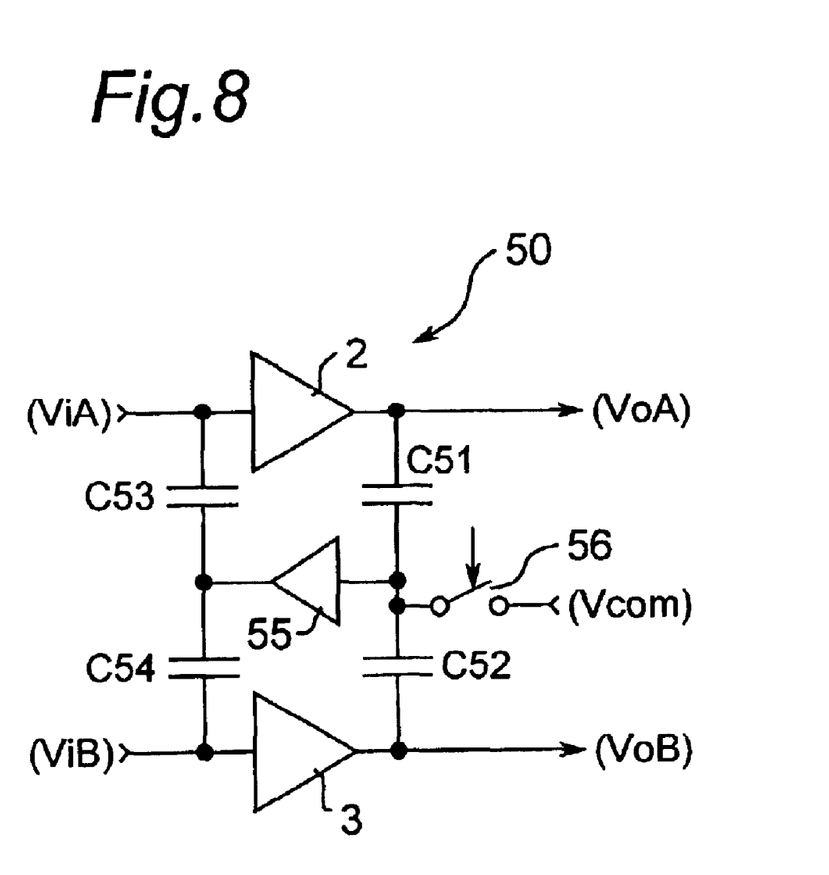
FIG. 8 is a drawing showing a pseudo-differential amplifier circuit in a second embodiment of the present invention.

FIG. 8 shows a pseudo-differential amplifier circuit in the second embodiment of the present invention. In FIG. 8, the components the same as in FIG. 1 are designated by the same numerals, their descriptions are omitted from here, and things different from FIG. 1 are described here. FIG. 8 differs from FIG. 1 in that the pseudo-differential amplifier circuit 50 has capacitors 51 through 54, a buffer circuit 55, and a switch 56. Switch 56 forms a switching section.

In FIG. 8, the pseudo-differential amplifier circuit 50 includes amplifiers 2 and 3, capacitors C51 through C54, a buffer circuit 55 that is a source follower, and a switch 56. Capacitors C51 and C52 are connected in series between the output terminal of amplifier 2 and the output terminal of amplifier 3. Capacitors C53 and C54 are connected in series between the input terminal of amplifier 2 and the input terminal of amplifier 3. The input terminal of buffer circuit 55 is connected to the junction between capacitors C51 and C52, and the output terminal of buffer circuit 55 is connected to the junction between capacitors C53 and C54. The reference voltage Vcom is applied to the junction between capacitors C51 and C52 through switch 56.

In such a configuration, the capacitances of capacitors C51 and C52 are the same. When switch 56 is turned on, and the reference voltage Vcom is applied to capacitors C51 and C52, capacitors C51 and C52 respectively memorize the difference between the reference voltage Vcom and the average value (VoP+VoM)/2 of the positive-side output voltage output from amplifier 2 and the negative side output voltage output from amplifier 3. Next, when switch 56 is turned off, and a cut-off state is created, the voltage difference memorized in capacitors C51 and C52 are applied to capacitors C53 and C54 through buffer circuit 55, so that the input voltages for amplifiers 2 and 3 are changed.

For example, when the average value $(VoP+VoM)/2$ of the output voltage VoP of amplifier 2 and the output voltage VoM of amplifier 3 becomes greater than the reference voltage Vcom, the input voltage ViB of buffer circuit 55 also becomes greater than the reference voltage Vcom. This change is conveyed to the output terminal of buffer circuit 55, and the voltage applied to capacitors C53 and C54 are raised, so that an electric charge equivalent to the voltage rise is transferred to capacitors C53 and C54. The polarity at this time is in the direction that reduces the input voltages for amplifiers 2 and 3 together. That is, the pseudo-differential amplifier circuit 50 operates in such a way as to suppress fluctuations in the average value of the positive-side output voltage and the negative-side output voltage. The case where the average value $(VoP+VoM)/2$ of the output voltage VoP of amplifier 2 and the output voltage VoM of amplifier 3 becomes lesser than the reference voltage Vcom is similar to the case where the average value becomes greater, so that the description is omitted.

Figure 9:
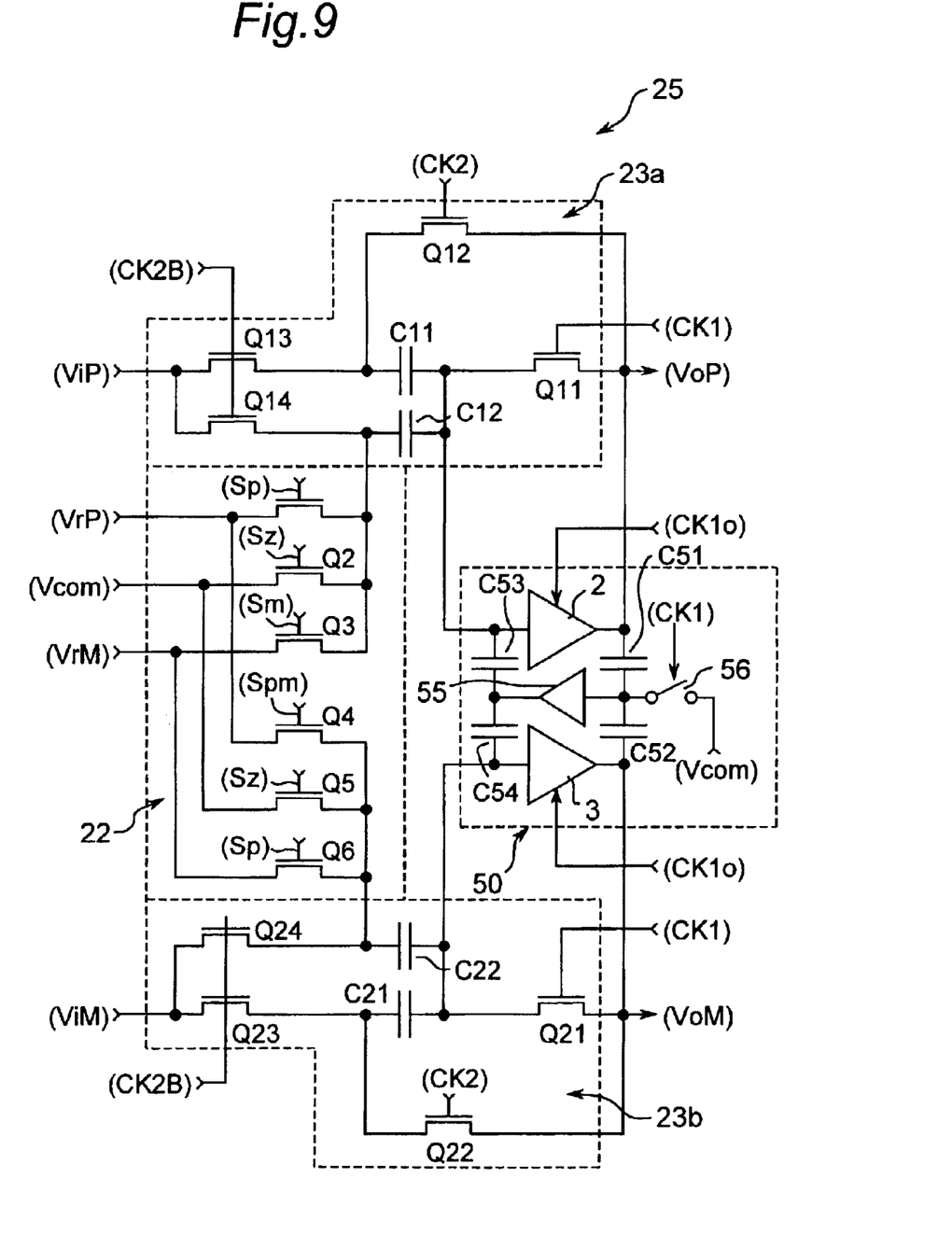
FIG. 9 is a drawing showing the arithmetic circuit 25 in FIG. 5 using the pseudo-differential amplifier circuit 50 in FIG. 8.

Next, the case where the pseudo-differential amplifier circuit 50 shown in FIG. 8 is used in arithmetic circuit 25 in FIG. 5 is described with reference to FIG. 9. In FIG. 9, the same components as in FIG. 5 are labeled with the same numerals, and their descriptions are omitted from here. In particular, the operation of the pseudo-differential amplifier circuit 50 is detailed in the following.

In FIG. 9, switch 56 performs switching, depending on the internal clock signal CK1 output from the internal-clock generator section 15. As described for first embodiment, arithmetic circuit 25 samples the positive-side input voltage ViP and the negative-side input voltage ViM and amplifies them to double the voltages. Further, arithmetic circuit 25 subtracts one of the reference voltages VrP, Vcom, and VrM from the amplified voltages, depending on the control signals from sub-A-D converter 21.

Therefore, arithmetic circuit 25 has two phases. In the first phase, arithmetic circuit 25 samples the positive-side input voltage ViP to the corresponding two capacitors C11 and C12 and samples the negative-side input voltage ViM to the corresponding two capacitors C21 and C22. In the second phase, arithmetic circuit 25 amplifies the sampled positive-side input voltage ViP and negative-side input voltage ViM in the pseudo-differential amplifier circuit to double the voltages. Arithmetic circuit 25 repeats such 2-phase operation performed at one-clock cycle.

In the phase of sampling the positive-side input voltage ViP and the negative-side input voltage ViM, NMOS transistor Q11 creates a short-circuit between the input and output terminals of amplifier 2, and NMOS transistor Q21 creates a short-circuit between the input and output terminals of amplifier 3. At this time, switch 56 in the pseudo-differential amplifier circuit 50 is turned on, to form a conductive state, and the reference voltage Vcom is applied to the input terminal of buffer circuit 55 and capacitors C51 and C52. At this time, capacitor C51 is charged with the voltage Vc1 defined by the following equation (7), and capacitor C52 is charged with the voltage Vc2 defined by the following equation (8).

$$VC1=Vcom-VoS, \quad (7)$$

$$Vc2=Vcom-VoS, \quad (8)$$

where VC1 is the voltage between the ends of capacitor C51, Vc2 is the voltage between the ends of capacitor C52, VoS is the positive-side output voltage VoP obtained by short-circuiting the input and output terminals of amplifier 2, and the negative-side output voltage VoM obtained by short-circuiting the input and output terminals of amplifier 3.

Next, switch 56 is turned off, and a cut-off state is created, the electric charge Q at the input terminal of buffer circuit 55 becomes the one defined by the following equation (9), Where C is the capacitance of capacitors C51 and C52.

$$Q=C\times(VC1+Vc2). \quad (9)$$

Next, NMOS transistors Q11 and Q21 are turned off, and cut-off states are formed. Then the positive-side output voltage VoP defined by the above equation (5) is output from the output terminal of amplifier 2, and the negative-side output voltage VoM defined by the above equation (6) is output from the output terminal of amplifier 3. If the voltage at the input terminal of buffer circuit 55 at this time is V1, then the electric charge Q becomes the one defined by the following equation (10), since the conservation of energy holds at the input terminal of buffer circuit 55.

$$Q=C\times(V1-VOP)+C\times(V1-VoM). \quad (10)$$

Further, the above equations (7) through (10) imply the following equation (11).

$$V1-Vcom=(VoP+VoM)/2-VoS. \quad (11)$$

The equation (11) shows that if the average value of the positive-side output voltage VoP and the negative-side output voltage VoM varies from VoS, V1 varies from the reference voltage by the variation amount. V1 is conveyed to one end of each of capacitors C53 and C54 through buffer circuit 55.

Next, the case where NMOS transistors Q11 and Q21 are turned off, to form cut-off states is described in the following. Suppose that the average value of the positive-side output voltage VoP and the negative-side output voltage VoM became greater than VoS by some influence, for example, a common offset voltage added to the positive-side input voltage ViP and the negative-side input voltage ViM. In this case, V1 becomes greater than the reference voltage Vcom by the variation amount, which is conveyed to the output terminal of buffer circuit 55, and raises the voltage applied to capacitors C53 and C54. Then, an electric charge equivalent to the voltage rise is transferred to capacitors C11 and C21, so that the output voltages of amplifiers 2 and 3 are reduced.

Therefore, in each of the A-D converter circuits AD1 through ADm, when the average value of the positive-side output voltage VoP and the negative-side output voltage VoM is going to vary from VoS, the variation can be suppressed, and the average value of the positive-side output voltage VoP and the negative-side output voltage VoM can be made constant at the predetermined reference voltage Vcom. Therefore, A-D converter circuit 40 that uses a conventional differential amplifier circuit is not required in any of the A-D converter circuit AD1 through ADm, so that parallel pipeline A-D converters that can achieve high performance and low power consumption can be obtained.

In this way, the pseudo-differential amplifier circuit in the second embodiment of the present invention makes capacitors C51 and C52 memorize the voltage difference between the reference voltage Vcom and the average value of the output voltage VoP from amplifier 2 and the output voltage VoM from amplifier 3, applies the voltage difference to capacitors C53 and C54 through buffer circuit 55, and varies the input voltage of amplifier 2 and 3 so as to cancel the voltage difference. By these means, a pseudo-differential amplifier circuit of high performance, low power consumption, and low-voltage operation can be obtained.

Switches SW1, SW2 in the above first embodiment and switch 56 in the second embodiment show switches formed by electric devices. However, these switches may be the ones having mechanical contacts if possible.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims, unless they depart therefrom.

What is claimed is:

1. A pseudo-differential amplifier circuit comprising:
   a first amplifier that amplifies a first input signal;
   a second amplifier that amplifies a second input signal that has the opposite signal level of said first input signal, said first and second amplifiers being of the same circuit configuration and having the same characteristics, and capable of performing pseudo differential amplification for said first and second input signals to output the obtained signals;
   first and second capacitors connected in series between the output terminals of said first and second amplifiers;
   third and fourth capacitors connected in series between the input terminals of said first and second amplifiers;
   a buffer section that conveys the voltage at the junction between said first and second capacitors to the junction between said third and fourth capacitors; and
   a switch section that applies a predetermined voltage to the junction between said first and second capacitors and controls the voltage, depending on input control signals,
   wherein when a predetermined voltage is applied to said first and second capacitors from said switch section, said first and second capacitors memorize the difference between said voltage and the average value of the voltages output from said first and second amplifiers, and the voltage difference is applied to said third and fourth capacitors through said buffer section.

2. The pseudo-differential amplifier circuit as defined in claim 1, wherein said first and second amplifiers are single-end amplifiers.

3. In an A-D converter having a sampling and hold circuit that samples and holds a pair of analog signals having mutually opposite voltage levels and a plurality of A-D converter circuits, each of which A-D converts a pair of output signals output from said sampling and hold circuit and performs arithmetic operations in a predetermined way for the A-D converted signals to output as a pair of input voltages for the proceeding A-D converter circuit, each of said A-D converter circuits comprising:
   a sub-A-D converter that A-D converts a pair of input voltages;
   a sub-D-A converter that D-A converts the data A-D converted in said sub-A-D converter;
   an arithmetic unit that performs predetermined arithmetic operations for the pair of said input voltages using the voltages D-A converted by said sub-D-A converter;
   a pseudo-differential amplifier circuit that comprises a pair of amplifiers and performs pseudo differential amplification for each voltage obtained in said arithmetic unit, said amplifiers being of the same circuit configuration and having the same characteristics,
   wherein said pseudo-differential amplifier circuit comprising:
      first and second capacitors that are connected in series between the output terminals of said first and second amplifiers;
      third and fourth capacitors that are connected in series between the input terminals of said first and second amplifiers;
      a buffer section that conveys the voltage at the junction between said first and second capacitors to the junction between said third and fourth capacitors; and
      a switch section that applies a predetermined voltage to the junction between said first and second capacitors and control the voltage, depending on input control signals,
      wherein when a predetermined voltage is applied to said first and second capacitors from said switch section, said first and second capacitors memorize the difference between said voltage and the average value of the voltages output from said first and second amplifiers, and the voltage difference is applied to said third and fourth capacitors through said buffer section.

4. The A-D converter as defined in claim 3, wherein said first and second amplifiers in said pseudo-differential amplifier circuit are single-end amplifiers.

5. In an A-D converter having a sampling and hold circuit that samples and holds a pair of analog signals having mutually opposite voltage levels and a plurality of A-D converter circuits, each of which A-D converts a pair of output signals output from said sampling and hold circuit and performs arithmetic operations in a predetermined way for the A-D converted signals to output as a pair of input voltages for the proceeding A-D converter circuit, at least one of said A-D converter circuits comprising:
   a sub-A-D converter that A-D converts a pair of input voltages;
   a sub-D-A converter that D-A converts the data A-D converted in said sub-A-D converter;
   an arithmetic unit that performs predetermined arithmetic operations for said pair of input voltages using the voltages D-A converted by said sub-D-A converter;
   a pseudo-differential amplifier circuit that comprises a pair of amplifiers and performs pseudo differential amplification for each voltage obtained in said arithmetic unit, said amplifiers being of the same circuit configuration and having the same characteristics,
   wherein each of the other A-D converter circuits of said A-D converter circuits comprising:
      a sub-A-D converter that A-D converts a pair of input voltages;
      a sub-D-A converter that D-A converts the data A-D converted in said sub-A-D converter;
      an arithmetic unit that performs predetermined arithmetic operations for said pair of input voltages using the voltages D-A converted by said sub-D-A converter; and
      a differential amplifier circuit that performs differential amplification for each voltage obtained in said arithmetic unit;
   wherein said pseudo-differential amplifier circuit comprising:
      first and second capacitors that are connected in series between the output terminals of said first and second amplifiers; third and fourth capacitors that are connected in series between the input terminals of said first and second amplifiers;
      a buffer section that conveys the voltage at the junction between said first and second capacitors to the junction between said third and fourth capacitors; and a switch section that applies a predetermined voltage to the junction between said first and second capacitors and control the voltage, depending on input control signals;

wherein when a predetermined voltage is applied to said first and second capacitors from said switch section, said first and second capacitors memorize the difference between said voltage and the average value of the voltages output from said first and second amplifiers, and the voltage difference is applied to said third and fourth capacitors through said buffer section.

6. The A-D converter as defined in claim 5, wherein said first and second amplifiers in said pseudo-differential amplifier circuit are single-end amplifiers.

* * * * *